US005189771A

United States Patent [19]

Fishman

[11] Patent Number: 5,189,771

[45] Date of Patent: Mar. 2, 1993

[54] METHOD OF MAKING A MUSICAL INSTRUMENT TRANSDUCER

[76] Inventor: Lawrence Fishman, 5 Green St., Woburn, Mass. 01801

[21] Appl. No.: 887,180

[22] Filed: May 21, 1992

Related U.S. Application Data

[60] Division of Ser. No. 642,398, Jan. 17, 1991, which is a continuation of Ser. No. 552,984, Jul. 16, 1990, Pat. No. 5,029,375, which is a continuation-in-part of Ser. No. 251,570, Sep. 30, 1988, Pat. No. 4,944,209, which is a continuation-in-part of Ser. No. 876,238, Jun. 19, 1986, Pat. No. 4,774,867, which is a continuation-in-part of Ser. No. 856,189, Apr. 28, 1986, abandoned.

[51] Int. Cl.$^5$ .............................................. H01L 41/22

[52] U.S. Cl. .................................. 29/25.35; 29/169.5; 84/731; 84/DIG. 24; 310/321

[58] Field of Search ............................ 29/25.35, 169.5; 84/730-732, DIG. 24; 310/321-325, 340

[56] References Cited

U.S. PATENT DOCUMENTS

| | | | |
|---|---|---|---|
| 2,324,024 | 7/1943 | Ream | 171/327 |
| 2,456,995 | 12/1948 | Robinson | 171/327 |
| 3,325,580 | 6/1967 | Barcus et al. | 84/1.16 |
| 4,147,084 | 4/1979 | Underwood | 84/1.16 |
| 4,278,000 | 7/1981 | Saito et al. | 84/1.16 |
| 4,314,495 | 2/1982 | Baggs | 84/1.16 |
| 4,491,051 | 1/1985 | Barcus | 84/1.16 |
| 4,514,247 | 4/1985 | Zola | 156/250 |
| 4,657,114 | 4/1987 | Shaw | 84/1.16 |
| 4,727,634 | 3/1988 | Fishman | 29/25.35 |
| 4,774,867 | 10/1988 | Fishman | 84/1.16 |
| 4,944,209 | 7/1990 | Fishman | 84/731 |
| 4,975,616 | 12/1990 | Park | 310/339 |
| 5,029,375 | 7/1991 | Fishman | 29/25.35 |

*Primary Examiner*—Carl E. Hall
*Attorney, Agent, or Firm*—Wolf, Greenfield & Sacks

[57] ABSTRACT

A transducer for a stringed musical instrument incorporating an electrically conductive ground plane, along with a piezoelectric transducer and a conductive strip. The piezoelectric transducer is comprised of a polyvinylidene flouride co-polymer. The ground plane, piezoelectric transducers and conductive strip are secured in a elongated unitary structure with the ground plane and conductive strip disposed on opposite sides of the transducers. A conductive shield is disposed about the unitary structure and electrical leads connect to the ground plane and conductive strip, respectively.

22 Claims, 5 Drawing Sheets

METHOD OF MAKING A MUSICAL INSTRUMENT TRANSDUCER

This application is a division of application Ser. No. 07/642,398 filed Jan. 17, 1991, (which in turn is a continuation of application Ser. No. 07,552,984 filed Jul. 16, 1990, now U.S. Pat. No. 5,029,375, which is a continuation-in-part of Ser. No. 07/251,570 filed Sep. 30, 1988, now U.S. Pat. No. 4,944,209, which in turn is a continuation-in-part of Ser. No. 06/876,238 filed Jun. 19, 1986 (which has issued into U.S. Pat. No. 4,774,867), which in turn is a continuation-in-part of Ser. No. 06/856,189 filed on Apr. 28, 1986, now abandoned).

BACKGROUND OF THE INVENTION

1. Field of the Invention

The present invention relates in general to a musical instrument transducer, and pertains, more particularly, to a piezoelectric transducer used with a stringed musical instrument and preferably for use with a guitar.

2. Background Discussion

At the present time, the prior art shows a variety of electromechanical transducers employing piezoelectric materials such as described in U.S. Pat. No. 3,325,580 or U.S. Pat. No. 4,491,051. Most of these piezoelectric transducers are not completely effective in faithfully converting mechanical movements or vibrations into electrical output signals which precisely correspond to the character of the input vibrations. This lack of fidelity is primarily due to the nature of the mechanical coupling between the driving vibratile member and the piezoelectric material. Some of these prior art structures such as shown in U.S. Pat. Nos. 4,491,051 and 4,975,616 are also quite complex in construction and become quite expensive to fabricate.

Accordingly, it is an object of the present invention to provide an improved piezoelectric transducer particularly for use with a stringed musical instrument such as a guitar.

Another object of the present invention is to provide an improved transducer as in accordance with the preceding object and which provides for the faithful conversion of string vibrations into electrical signals that substantially exactly correspond with the character of such vibrations.

Another object of the present invention is to provide a piezoelectric transducer made of a polyvinylidene co-polymer with enhanced performance Still a further object of the present invention is to provide an improved musical instrument transducer as in accordance with the preceding objects and which is relatively simple in construction, can be readily fabricated and which can also be constructed relatively inexpensively.

Another object of the present invention is to provide an improved musical instrument transducer that is readily adapted for retrofit to existing stringed instruments without requiring any substantial modification thereto.

SUMMARY OF THE INVENTION

To accomplish the foregoing and other objects, features and advantages of the invention, there is provided a transducer for a stringed musical instrument that is adapted to be positioned adjacent the instrument strings to receive acoustic vibratory signals therefrom. The musical instrument transducer comprises an electrically conductive ground plane, a piezoelectric transducer and a conductive strip.

The piezoelectric transducer is a polyvinylidene fluoride co-polymer having a preferred degree of crystallinity greater than about 70 percent. The transducer can have a variety of different configurations. In a preferred embodiment of the invention, the piezoelectric transducer is a plurality of separate piezoelectric crystal transducers each of substantially disk-like shape and each adapted to be aligned with an individual instrument string. In accordance with one version of the present invention, the diameter of a disk-like transducer is on the order of 1/16th inch and the thickness is on the order of 0.020 inch. In one alternate embodiment of the invention, the individual piezoelectric crystal transducers can be of square or rectangular shape. In another embodiment of the invention, a single, elongated piezoelectric transducer sheet of substantially flat form is provided. In another embodiment of the invention, a plurality of elongated and substantially flat piezoelectric transducer sheets is provided as a laminate. Each transducer in this laminated arrangement is of substantially equal thickness. The thickness of the single elongated piezoelectric transducer sheet, as well as the combined thickness of the laminate, is on the order of 50 to 1000 microns.

The ground plane is a thin elongated metal sheet preferably of beryllium copper and having a right angle end tab. The ground plane may also be of other conductive material such as brass. The conductive strip is preferably comprised of a circuit board including a dielectric baseboard carrying a conductive cladding that defines the conductive strip. There also can be provided a resilient electrically-conductive layer disposed between the transducer and conductive strip. This conductive layer is preferred to be of carbon fiber. Means are provided for securing the ground plane, piezoelectric transducers, and conductive strip in an elongated unitary structure with the piezoelectric transducer disposed between the ground plane and conductive strip.

A conductive shield is disposed about the unitary structure. Electrical contact is provided between the shield and the ground plane. Electrical leads also connect the ground plane and conductive strip which, in turn, provides electrical continuity to opposite sides of the crystals. The electrical leads include a first electrical lead soldered to the ground plane and a second electrical lead soldered to the conductive cladding.

In accordance with one embodiment of the invention, an elongated piezoelectric transducer sheet, or a laminate consisting of a plurality of elongated transducer sheets, is optionally bonded to either one or another of the conductive strip or ground plane. In another embodiment of the invention, a plurality of piezoelectric crystals are bonded to the carbon fiber strip in order to properly align the individual crystals. The bonding of the piezoelectric transducers on only one face also provides some crystal defamation so as to increase the voltage level of the output signal.

A module is provided for fabricating a stringed instrument transducer. This module is adapted to be positioned adjacent to the instrument's strings in order to receive acoustic vibratory signals. The module includes a conductive shield disposed as an integral unit around a first conductive member. The conductive shield is disposed only along a portion of the length of the first conductive member and the remaining unshielded length defines a conductive tailpiece. This tailpiece is designed to receive a series of components including a second elongated electrically conductive member and a polyvinylidene fluoride co-polymer piezoelectric transducer. The tailpiece can rotate about a junction between a first position where the piezoelectric transducer and conductive means are outside the shield means and a second position where the tailpiece is moved about 180° so that the unitary structure is placed inside the shield means. This module provides an easy method of fabricating the transducer of the invention having both fewer manufacturing steps and fewer manipulations of the transducer components.

BRIEF DESCRIPTION OF THE DRAWINGS

Numerous other objects, features and advantages of the invention should now become apparent upon a reading of the following detailed description taken in conjunction with the accompanying drawing, in which.

DETAILED DESCRIPTION

Figure 1:
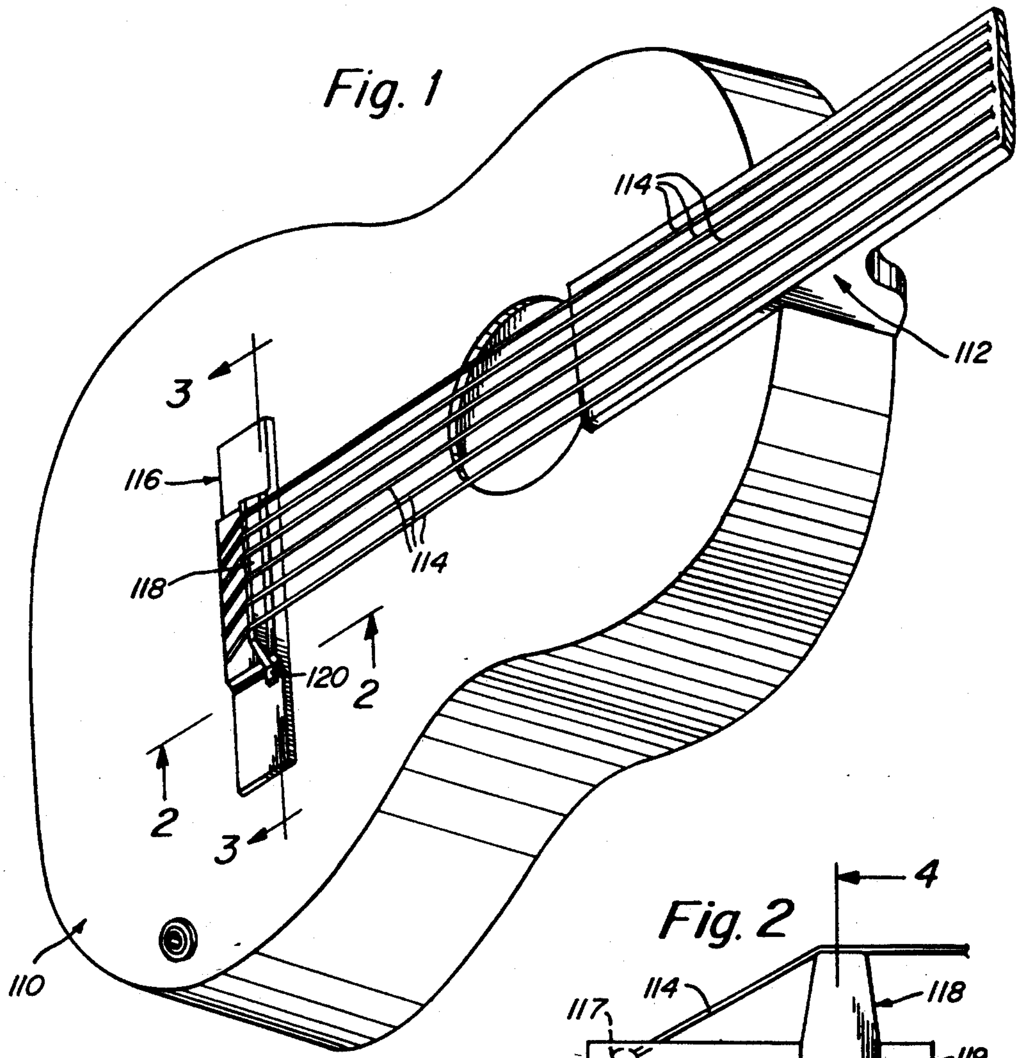
FIG. 1 is a perspective view of a stringed musical instrument and in particular a guitar that has incorporated therein the transducer of the present invention.
Figure 2:
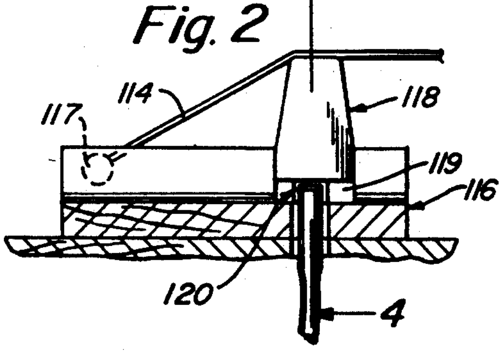
FIG. 2 a cross-sectional view taken along line 2—2 of FIG. 1.
Figure 3:
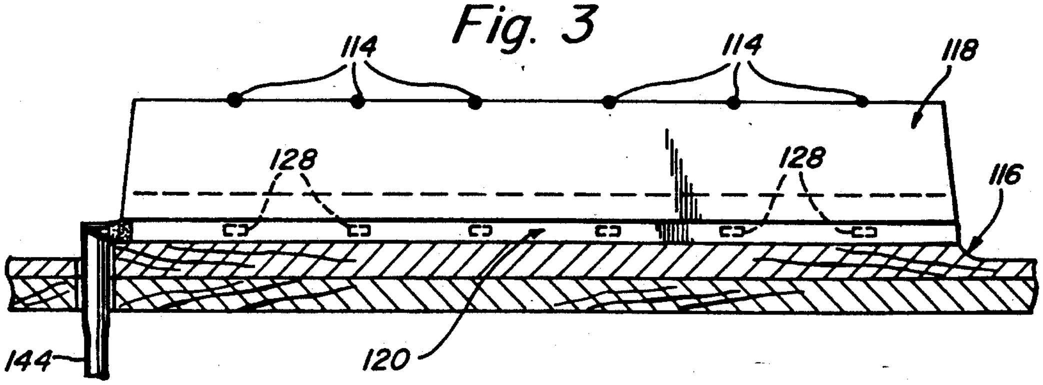
FIG. 3 is a cross-sectional view taken along line 3—3 of FIG. 1 and illustrating the placement of individual crystals relative to the strings.

Reference is now made to the drawings and in particular to FIGS. 1-3. FIG. 1 illustrates a guitar that is comprised of a guitar body 110 having a neck 112 and supporting a plurality of strings 114. In the embodiment disclosed herein, such as illustrated in FIG. 3, there are six strings 114. The strings 114 are supported at the neck end of the instrument, but are not illustrated herein. At the body end of the strings, the support is provided by means of the bridge 116. The bridge 11 includes means, such as illustrated in FIG. 2 for securing the end 117 of each of the strings 114.

The bridge 116 is slotted such as illustrated in FIG. 2 in order to receive the saddle 118. The strings 114 are received in notches in the saddle 118 at the top surface thereof.

In an existing instrument, in order to install the musical instrument transducer 120 of the present invention, the tension on the strings 114 is removed and the saddle 118 can then be lifted out of the slot in the bridge. The transducer 120 is then inserted in this slot 119. The saddle 118 may then be cut at its bottom end to remove a portion thereof. The portion removed is approximately equal to the height of the transducer 120 so that when the saddle 118 is reinstalled (see FIG. 2) then the saddle will assume the same height above the bridge.

The piezoelectric transducers 128 of this invention are more accurately termed piezoelectric polymers. The materials employed herein are amorphous structures containing many thousand individual crystals and are constructed by combining different polymeric elements and subjecting them to high temperatures which forms a fused material containing thousands of crystals. The piezoelectric polymer used in this invention is a polyvinylidene fluoride (PVDF) co-polymer. In particularly preferred embodiments, this polyvinylidene fluoride co-polymer has a degree of crystallinity greater than about 70 percent.

The co-polymerization of polyvinylidene fluoride (PVDF) homopolymer with other polymeric materials provides distinct advantages in obtaining the required degree of crystallinity. PVDF homopolymer is difficult to make with crystallinities greater than 70 percent. Moreover, at higher crystallinities of the PVDF homopolymer, the resulting substance becomes too brittle and cannot be made into elongated sheets necessary for certain embodiments of this invention. By carefully controlling process steps involved in co-polymerization, a highly piezoelectric co-polymer of PVDF can be produced having a degree of crystallinity greater than about 70 percent and having the required resiliency to be made into thin elongated strips. This is of great benefit in manufacture of the transducers of this invention because it eliminates the need for a resilient and electrically conductive layer 136 in certain embodiments of the invention.

PVDF homopolymers are described in U.S. Pat. No. 4,975,616 (Park, K. T., Dec. 4, 1990). PVDF co-polymers can include, but are not limited to, vinylidene/tetrafluoroethylene and vinylidene/trifluoroethylene polymers. As used herein, the term "piezoelectric crystal" and "piezoelectric sheet" are used interchangeably to refer to piezoelectric transducers that are co-polymers of PVDF.

Figure 4:
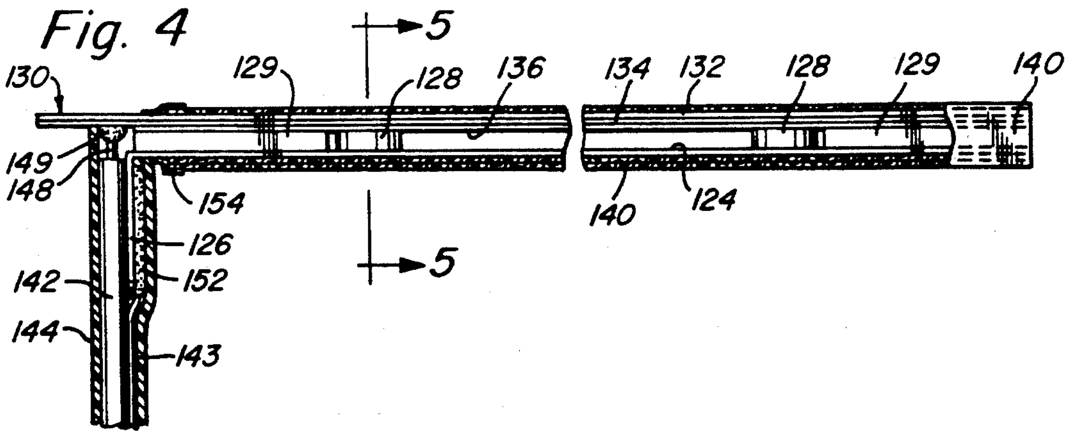
FIG. 4 is a cross-sectional view taken along line 4—4 of FIG. 2 illustrating further details of the musical instrument transducer.
Figure 5:
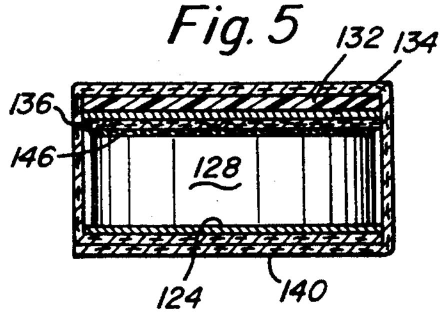
FIG. 5 is a cross-sectional view taken along line 5—5 of FIG. 4 through one of the crystals.
Figure 6:
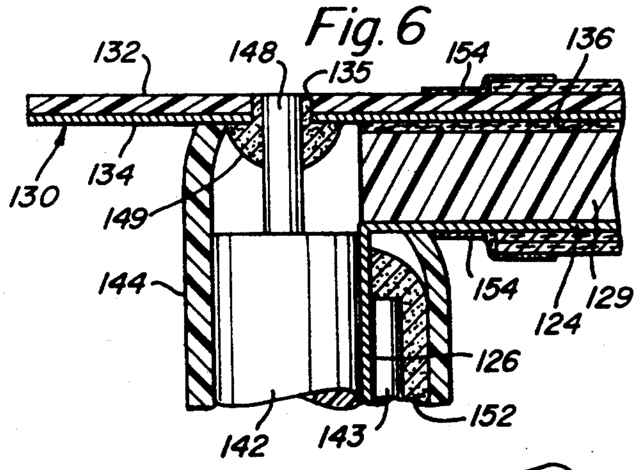
FIG. 6 is a more detailed cross-sectional view showing the portion of the transducer wherein the input leads connect.
Figure 7:
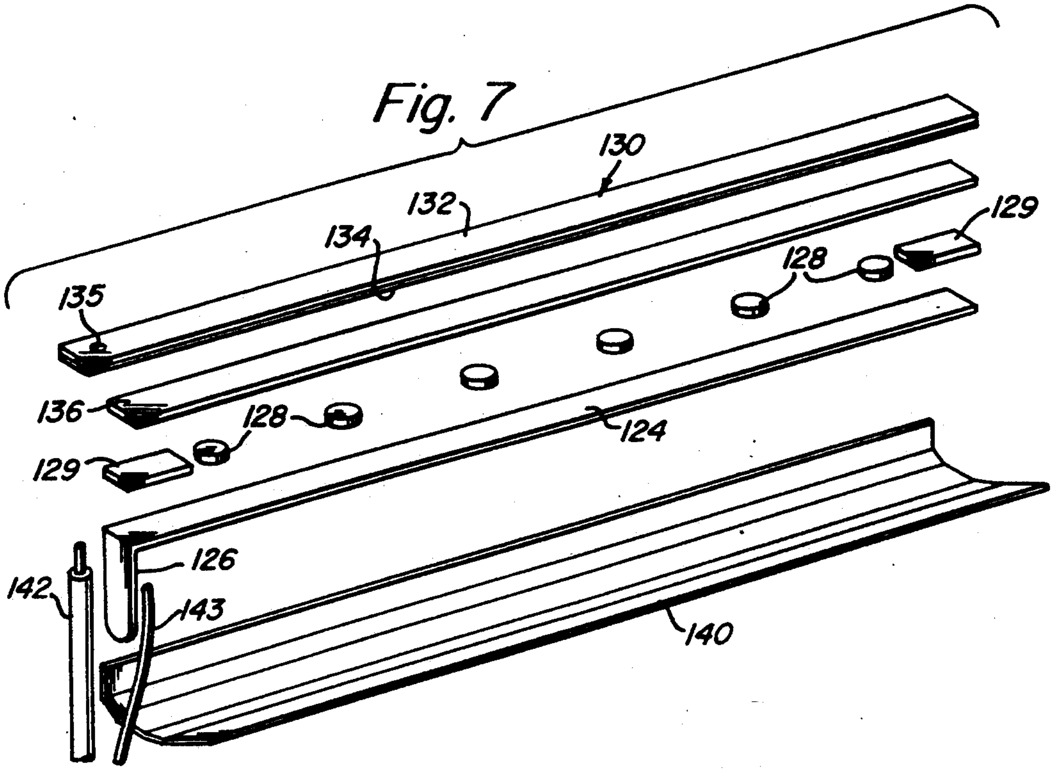
FIG. 7 is an exploded perspective view illustrating the different components that comprise the transducer of the invention.

With regard to the further details of the musical instrument transducer 120, reference is furthermore made to FIGS. 3-7 which illustrates one preferred embodiment of the invention in which the PVDF piezoelectric transducer is an array of separate piezoelectric crystals 128, preferably having a degree of crystallinity of greater than at least about 70 percent. FIG. 3 illustrates the specific placement of the piezoelectric crystals 128 as they relate to the strings 114. FIG. 6 shows specific details of the connection of the electrical leads to the transducer. In particular, FIG. 7 is an exploded perspective view illustrating the individual components that comprise one embodiment of the musical instrument transducer.

The ground plane 124 is a thin, elongated metal sheet preferably constructed of beryllium copper. Ground plane 124 can also be made of brass. The ground plane 124 provides a contact to one side of each of the plurality of piezoelectric crystals 128. These crystals 128 are disposed in a spaced relationship as indicated in FIG. 3. In this regard, with reference to the crystals 128, it is noted that they are of the disk-shape as illustrated, and in one embodiment are of 1/16th inch diameter by 0.020 inch thick. The electrodes of each crystal are at the respective top and bottom surfaces thereof. Thus, contact to the crystal occurs through the ground plane 124 by virtue of the ground plane contacting the lower electrode of each of the piezoelectric crystals.

The other conductive contact to each of the individual piezoelectric crystals is provided by a conductive strip defined by the elongated circuit board 130. The circuit board 130 includes a dielectric epoxy fiberglass layer 132 having a copper clad layer 134 deposited thereon. It is also noted that the circuit board 130 has a hole 135 at one end thereof for providing a solder connection. In this regard, refer to the detailed cross-sectional view of FIG. 6.

The musical instrument transducer 120, such as depicted in FIG. 7, also includes a resilient and electrically conductive layer 136 that is disposed adjacent the top side of each of the crystals 128. The layer 136 is conductive and provides electrical conductivity along with the necessary resiliency between the crystals 128 and the copper cladding 134.

In FIG. 7 there is shown the wrapping paper 140. This is preferably a parchment having a high linen content. This is preferably 100% rag paper that provides a complete wrapping about the transducer such as illustrated in the cross-sectional view of FIG. 5. The paper 140 is painted with a nickel-filled colloid (paint). This colloid provides a shield about the transducer and in an alternate embodiment, instead of being a nickel-filled colloid may be filled with any conductor such as graphite or copper. This combination of a parchment type paper along with the nickel-filled colloid (paint) provides an extremely effective shield about the transducer and provides it in a relatively simple manner. In addition to providing an extremely effective shield, the combination of paper and paint wrapping represent a substantial improvement over prior shielding techniques such as described in U.S. Pat. No. 4,491,051. Because the paper is a dielectric itself there are no shorting problems. This arrangement also eliminates the need for an additional layer of insulating material that definitely is necessary when using a metal foil such as in U.S. Pat. No. 4,491,051.

Finally, in FIG. 7 there are illustrated the end spacers 129 which are preferably of a dielectric material and which may be made of a compressible material. Also disclosed are a pair of leads 142 and 143 that connect respectively to the circuit board 130 and the ground plane 134 as will be described in further detail hereinafter.

As indicated previously, the crystals 128 are of relatively small size and are provided with electrodes on the top and bottom surface thereof. It has been found in this embodiment that a circular type of crystal is better than a rectangular-shaped one. With the rectangular crystal, there are edge effects that interfere with proper signal transduction. Such edge effects are substantially reduced by the use of circular crystals.

FIG. 4 is a cross-sectional view showing the spaced crystals and furthermore illustrating the ground plane 124 and its associated tab 126. FIG. 4 also illustrates the connection of the electrical leads. This includes the leads 142 and 143. The lead 143 is soldered to the tab 126. The lead 142 couples to the solder hole 135 for connection to the circuit board 130.

FIG. 5 is a cross-sectional view taken along line 5—5 of FIG. 4 showing the different layers that comprise the musical instrument transducer. It is noted in FIG. 5 that there is also illustrated, a conductive adhesive layer 146 that attaches the crystal 128 to the carbon fiber layer 136. It is noted in FIG. 5 that an adhesive layer is only provided on one side of the crystal 128 thus bonding the crystal on only one side thereof. FIG. 5 also clearly illustrates the wrapping of the outer shield formed by the single wrapping of the paper 140.

Each of the PVDF piezoelectric crystals 128 illustrated in FIGS. 4 and 7 may be bonded to either a relatively rigid member such as the carbon fiber strip 136 or the ground plane 124. In the disclosed embodiment of FIG. 7, the crystals are bonded to the carbon fiber strip 136. The ground plane 124 on the other side of the crystals is not bonded to the crystals. A carbon fiber strip has been chosen as the preferred form although other conductive metal materials may also be employed. The described method of construction provides a unitary structure (carbon fiber strip/crystals) that is held in a somewhat sliding configuration with regard to the ground plane and the conductive strip. This provides a very flexible structure that can readily bend and conform to any irregularities in the slotted bridge.

Bonding of the crystals to the carbon fiber strip provides a way to maintain the proper crystal location with regard to the strings yet have the crystals relatively isolated. This is a clear improvement over prior art techniques described in U.S. Pat. No. 4,491,051. In that patent they maintain crystal location by employing spacers between the crystals. This is undesirable because of the side-to-side contact between the crystals and the spacers.

Because the crystals are sensitive to vibration in the shear mode as well as in the compressive mode, any undesirable vibrations, such as instrument body noise, which may create vibrations in the lateral direction are thus translated to all of the crystals which in turn add them to the output signal. In the case of isolated crystals, these lateral vibrations are not picked up, and the resulting output is a much clearer representation of the actual string vibrations. In this regard note, for example, in FIG. 4 of the present application as well as in FIG. 7, that there is a clear void space between each of the crystals 128.

The bonding of the crystals on only one face also provides an increase of voltage level to the output signal. As the crystal is compressed it tends to deform. Since only one surface is restricted by the bond, the resulting deformation causes bending to occur at the bonded surface. This bending stresses the entire surface and thus adds to the overall output voltage. The resulting signal is larger than that of an unbonded crystal under simple compression.

FIG. 6 is a detailed cross-sectional view showing in particular the connection of the electrical leads to the musical instrument transducer. In this regard it is noted that the leads 142 and 143 have a plastic shrink tubing 144 extending thereover. The lead 142 has its center conductor 148 soldered at 149 to the circuit board 130, to in particular provide a conductive connection to the cladding 134. As indicated previously, the lead 143 has its conductor soldered as at 152 to the tab 126 of the ground plane 124. FIG. 6 illustrates one embodiment for providing conductivity between the shield and ground plane. This is illustrated with a conductive paint 154 which it is noted provides electrical conductivity from the shield to the ground plane. The paint is applied so that there is no electrical conductivity to the circuit board. In this regard, refer also to a method of providing conductivity as illustrated and described in co-pending application Ser. No. 07/552,984, incorporated herein by reference.

Reference is now made to FIGS. 8–16 for an illustration of further alternate embodiments of the present invention. The same reference characters are being used to identify similar components previously identified in earlier embodiments described herein.

Figure 8:
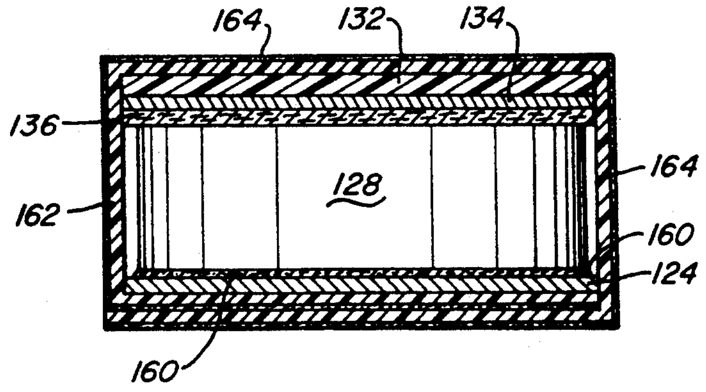
FIG. 8 is a cross-sectional view through an alternate construction of the transducer in which the piezoelectric crystals are bonded to the ground plane and in which the shield is provided by a thin plastic sheet having a metal vapor deposited thereon.

In the embodiment of FIG. 8, a cross-sectional view similar to that of FIG. 5, the PVDF co-polymer piezoelectric crystal is adhesively secured to the ground plane 124 rather than to the carbon fiber layer 136. In this embodiment, there is illustrated the circuit-board 130 comprised of a fiber layer 132 and copper-clad layer 134. Also illustrated is the carbon fiber layer 136. For this purpose, there is illustrated in FIG. 8 the conductive adhesive layer 160, which may be a conductive epoxy. It is noted that this layer is disposed between the piezoelectric crystal 128 and the ground plane 124.

FIG. 8 also illustrates an alternate form of the electrical shield for the device. Rather than providing the structure illustrated in FIGS. 5 and 7, the shield is constructed, in the embodiment of FIG. 8, in the form of a thin plastic layer 162 that may be, for example, relatively thin Mylar. There is deposited on the outer surface of the layer 162 a thin metal layer 164. This may be formed by a metal vapor deposition process. The layer 164 may be a thin layer of, for example, copper or aluminum. The shield may be coupled to, for example, the ground plane 124, in a similar manner to that described in co-pending application Ser. No. 07/552,984, incorporated herein by reference.

In the embodiment of FIG. 8, it is noted that the layer 160 is only provided on one side of the crystal 128, thus bonding the crystal 128 on only one side thereof. As indicated previously, this has an advantage regarding enhanced transducer output. It is thus noted in FIG. 8 that no adhesive layer appears at the top of the crystal between the crystal 128 and the layer 136.

Figure 9:
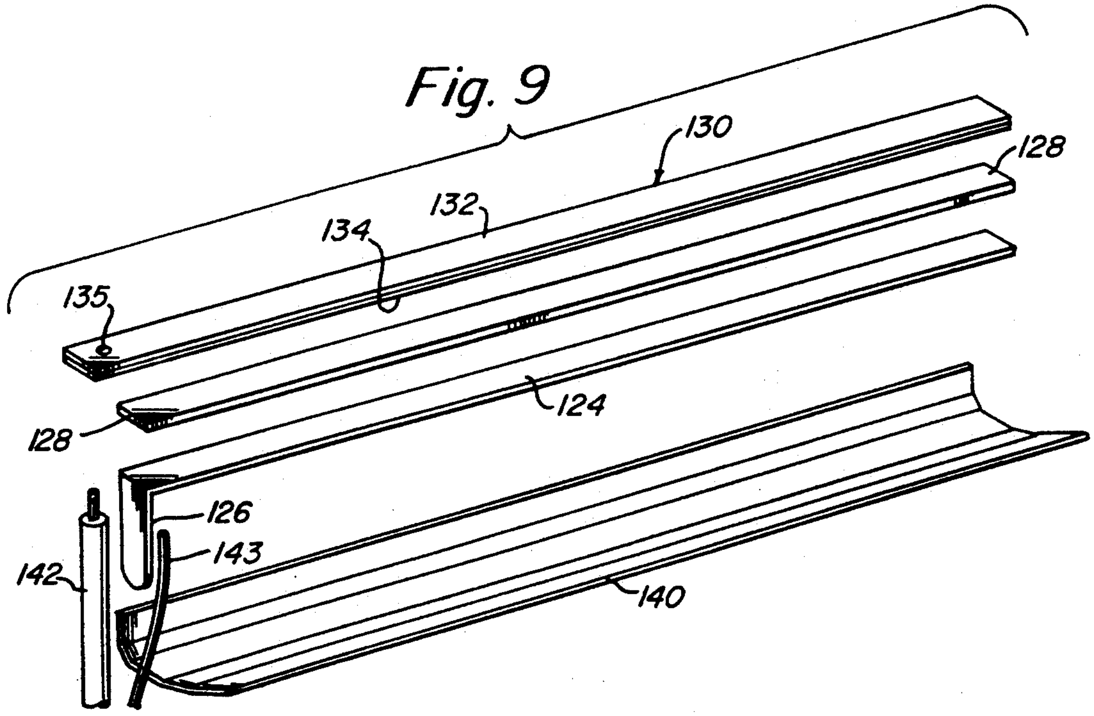
FIG. 9 is an exploded perspective view illustrating the different components that comprise another embodiment of the transducer of the invention.

In the embodiment of FIG. 9, an exploded perspective view is shown illustrating the individual components that comprise yet another embodiment of the invention.

As previously indicated, ground plane 124 is a thin elongated metal sheet preferably made of beryllium copper although it can be fabricated of brass. Ground plane 124 provides a contact to one side of a thin, elongated piezoelectric transducer sheet 128 made of polyvinylidene fluoride co-polymer. The preferred piezoelectric PVDF co-polymer sheet has a degree of crystallinity greater than about 70 percent. The sheet is preferably rectangular in shape and is between about 50 microns and about 1000 microns in thickness. In particularly preferred embodiments, the thickness is about 500 microns.

Electrodes of this single, contiguous sheet are disposed at the respective top and bottom surfaces thereof. Therefore, as described previously, contact to the contiguous transducer sheet occurs through the ground plane 124 by virtue of the ground plane 124 contacting the lower electrode of the transducer sheet 128. The other conductive contact to the single transducer is provided by the elongated circuit board 130, including the dielectric fiberglass layer 132 and copper clad layer 134 deposited thereon. Because of the resiliency of the elongated piezoelectric transducer sheet 128, a resilient and electrically conductive layer made of carbon fiber is not needed.

Figure 16:
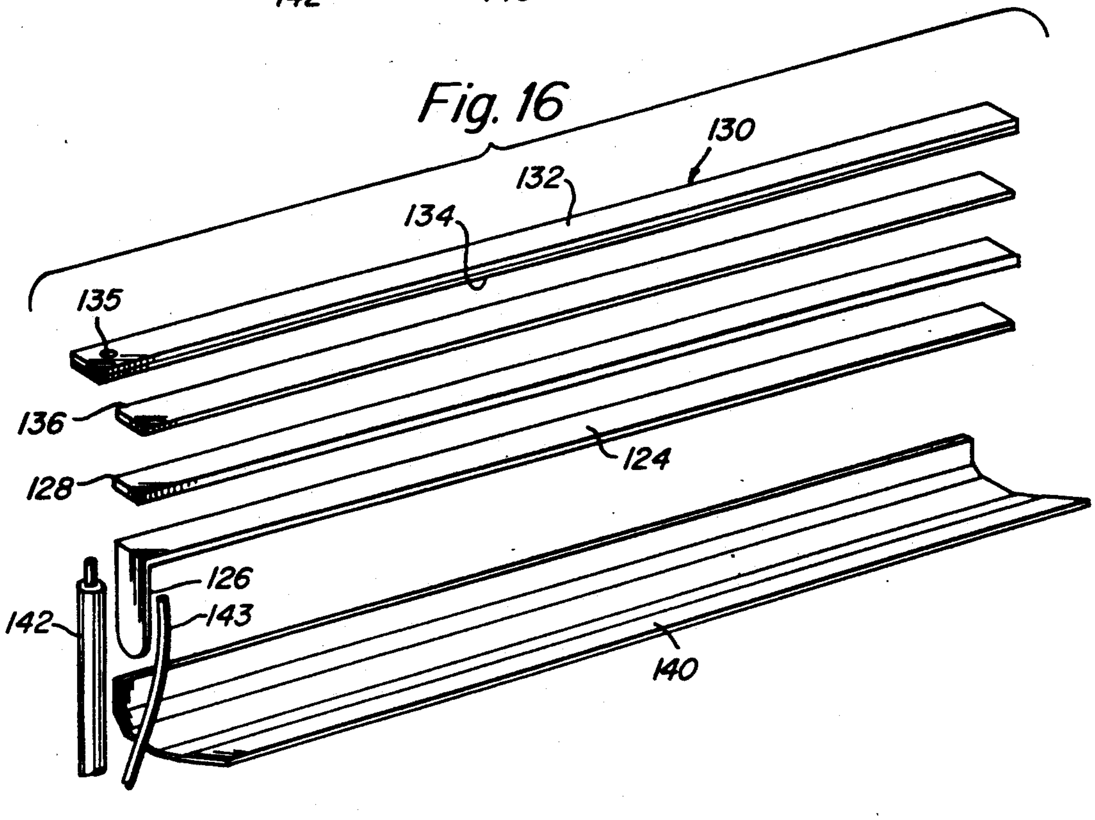
FIG. 16 is an exploded perspective view illustrating the different components that comprise another embodiment of the transducer of the invention.

Nevertheless, a conductive layer of carbon fiber can be disposed against the transducer sheet, as illustrated in the embodiment of FIG. 16. In this embodiment, as in the others previously described, the transducer sheet may be conductively bonded to either of the carbon fiber strip 136, or ground plane 124. As before, bonding is preferred but is not essential.

Referring again to FIG. 9, a conductive adhesive layer can be provided on one side of transducer 128. In this manner, the conductive adhesive layer can bond piezoelectric transducer sheet 128 to either the ground plane 124 or the copper clad layer 134 of the circuit board 130. Bonding of the elongated piezoelectric transducer sheet is preferred but in an alternate embodiment may be eliminated in which case the resilient nature of the elongated piezoelectric crystal can provide a very flexible structure that can readily bend and conform to any irregularities in the slotted bridge of the musical instrument without the need for conductive adhesive layers. FIG. 9 also shows the wrapping paper 140 that can be painted with a nickel-filled colloid.

Figure 10:
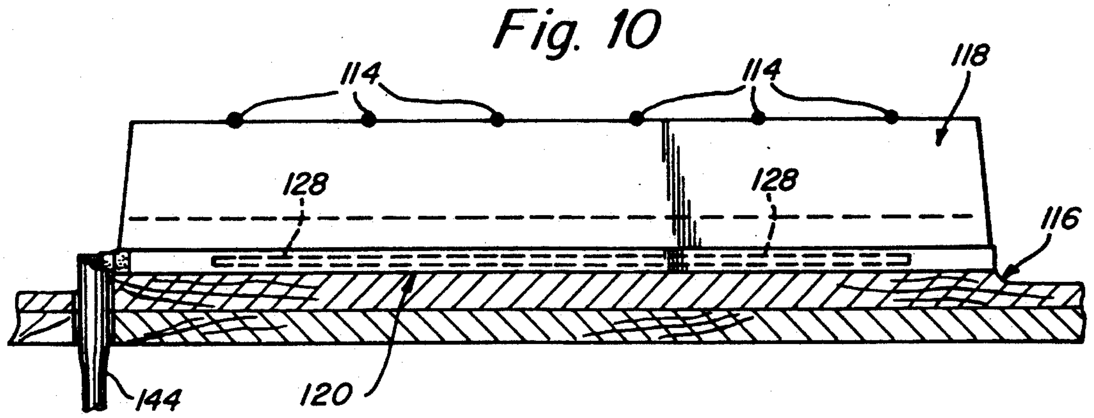
FIG. 10 is a cross-sectional view taken along line 3—3 of FIG. 1 and illustrating the placement of a piezoelectric transducer sheet relative to the strings.

Piezoelectric transducer sheet 128 is disposed in a spaced relationship to the guitar strings as indicated in FIG. 10.

Figure 11:
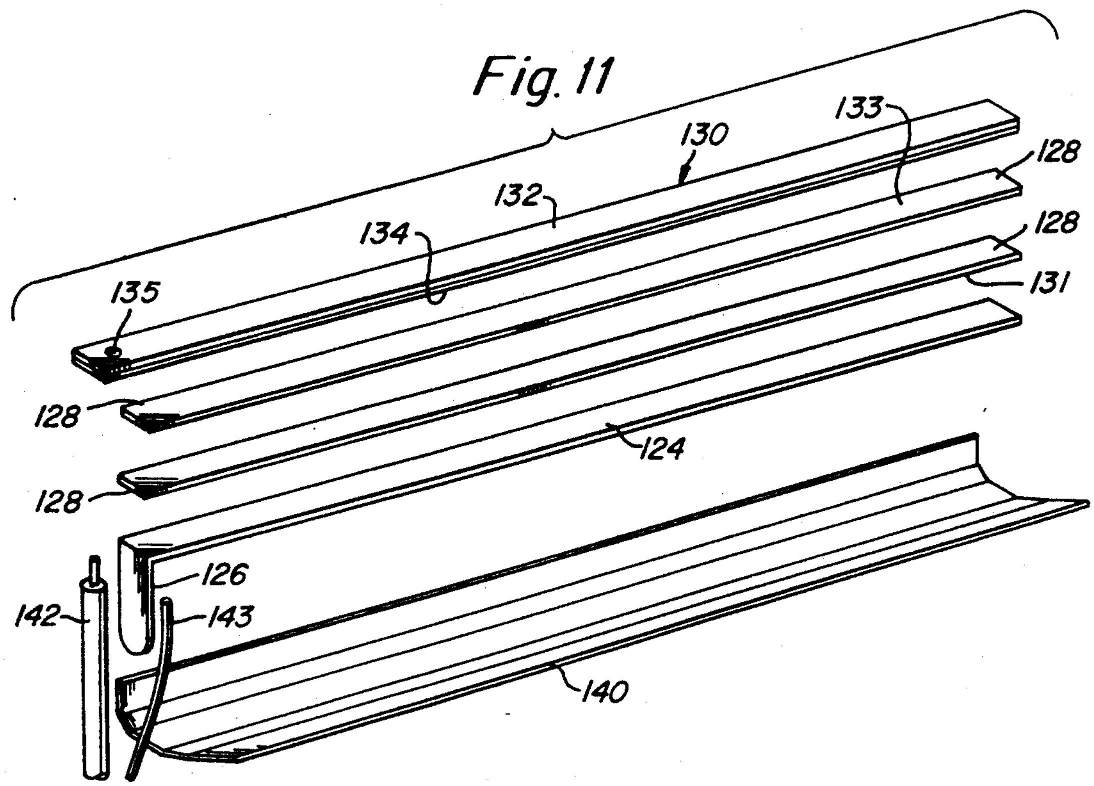
FIG. 11 is an exploded perspective view illustrating the different components that comprise yet another embodiment of the invention.

In a further embodiment of the invention, illustrated in FIG. 11, the piezoelectric transducer consists of a plurality of PVDF co-polymer transducer sheets 128 that are superimposed in a laminated configuration. The sheets need not be bonded to each other. The length of the laminated piezoelectric sheets are substantially equal to the length of ground plane 124. Ground plane 124, as described above, provides contact to a lower side 131 of the piezoelectric transducer laminate 128. Elongated circuit board 130 having fiberglass layer 132 and copper clad layer 134 provides contact with an upper side 133 of the piezoelectric transducer laminate 128.

The transducer illustrated in FIG. 11 displays unexpected acoustic properties. It has been demonstrated that a laminated piezoelectric transducer as shown in FIG. 11 of finite total thickness provides better acoustic performance than a single elongated piezoelectric transducer sheet having the identical total thickness. While not wishing to be bound by any particular theory, it is believed that the resonance frequencies of the individual piezoelectric sheets of the laminate are additive and this results in better performance with higher order harmonics than a single piezoelectric transducer sheet.

The total thickness of the piezoelectric laminate, as illustrated in FIG. 11, is preferably about 500 microns and each individual piezoelectric strip is of about equal thickness. Thus, a piezoelectric laminate 128 with total thickness of 500 microns preferably consists of two piezoelectric sheets, each of about 250 micron thickness.

As described above with reference to FIG. 9, the resilient and electrically conductive carbon fiber layer 136 is also unnecessary in the embodiment of FIG. 11 since the resilient nature of the elongated piezoelectric transducer sheets provides electrical conductivity along with the necessary resiliency. One of the upper or lower sides of this piezoelectric laminate may optionally be bonded to either the ground plane 124 or the copper clad layer 134 deposited on circuit board 130.

In other embodiments of the invention, heat-shrink tubing can be used for forming an electrical shield around the piezoelectric transducers. Reference is made to co-pending application Ser. No. 07/552,984 which describes procedures for disposing heat-shrink tubing over the transducer elements.

Figure 12:
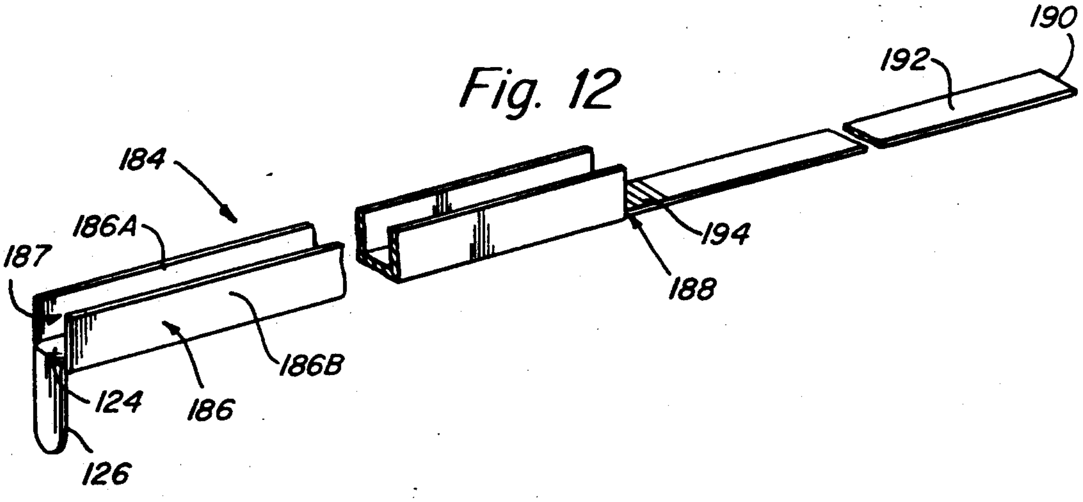
FIG. 12 is a perspective view of a ground plane module used in the fabrication of the transducer of the present invention.
Figure 13:
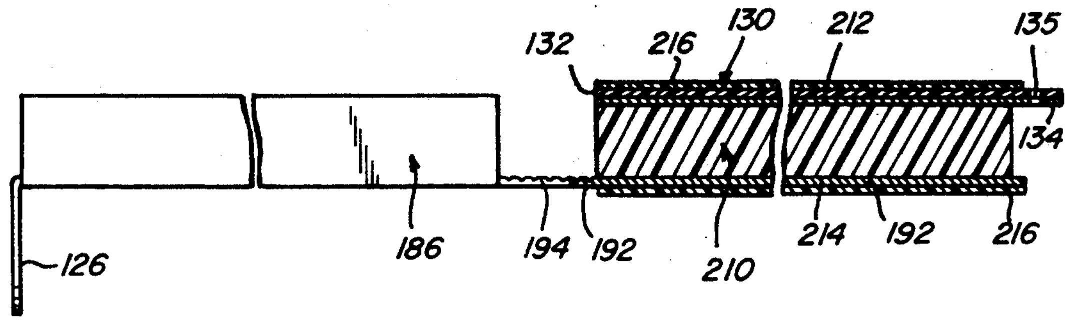
FIG. 13 is a cross-sectional view through a ground plane module illustrating the configuration of a piezoelectric transducer in relation to the ground plane and electrically conductive circuit board.
Figure 14:
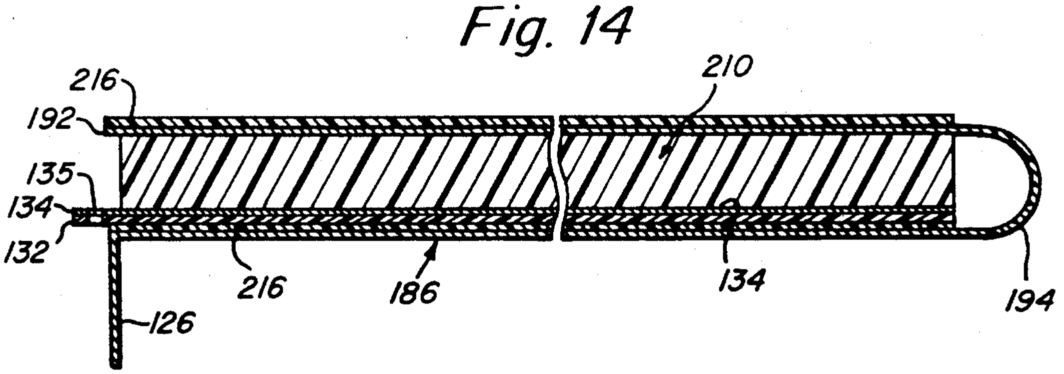
FIG. 14 is a cross-sectional view of the ground plane module of FIG. 13 in its folded configuration that illustrates shielding of the piezoelectric transducer and circuit board within the shield means.

FIGS. 12 to 14 illustrate a further embodiment of the invention used to simplify housing of the piezoelectric crystal and associated electrically conductive components.

Referring to FIG. 12, a ground plane module 184 is provided. Module 184 includes a thin, elongated ground plane 124 preferably of beryllium copper. As described previously, this ground plane is provided at one end with a right angle tab 126. The module also includes a shield 186 comprised of walls 186A and 186B, tailpiece 192, all integral with each other, and of beryllium copper. The shield begins adjacent to the right angle tab 126 and extends along the module, terminating in a point 188 slightly less than midway between the right angle tab and the opposite end 190 of the ground plane module 184. Shield 186 also extends along its length in a direction orthogonal to the ground plane defining a channel 187.

The ground plane 124 extends beyond the point 188 at which the shield terminates to define a tailpiece 192. At a position 188 immediately adjacent to the terminus of the shielding, the tailpiece 192 is provided with a flexible junction 194 to enable the tailpiece to rotate 180° so that it can rest within the channel 187 formed by the shielding. The length of the tailpiece is slightly greater than the distance from the right angle tab 126 to the end of the shielding 188.

The simplified method of construction using the ground plane module is illustrated in FIGS. 13 and 14. In FIG. 13, a PVDF co-polymer piezoelectric transducer 210 having an upper face 212 and a lower face 214 is positioned on the tailpiece 192. Preferably, the transducer 214 is an elongated rectangular sheet, substantially equal in area to the tailpiece. To the upper face 212 of the piezoelectric sheet is positioned a conductive member. Preferably, the conductive member is a circuit board 130 including a dielectric fiberglass layer 132 on which is deposited a copper cladding layer 134, which layer 134 is in contact with transducer 210. It is also noted that circuit board 130 has a hole 135 defined therein at a position near the end of the tailpiece furthest away from the right angle tab 126. A layer of untreated heat-shrink plastic tubing 216 of length equal to the piezoelectric sheet 210 is placed over the combined structure defined by the tailpiece 192, piezoelectric sheet 210, conductive member 130, fiberglass layer 132 and copper cladding 134. The tubing 216 acts as an effective insulator and is preferably made of 2 mil Mylar.

It should be understood that the configuration of the piezoelectric transducer used in the ground plane module is not limited to an elongated sheet of PVDF copolymer, as illustrated in FIG. 13. Any of the embodiments of piezoelectric transducer previously described would serve as well. Individual piezoelectric crystals can also be positioned in a spaced relationship on the tailpiece in order to be aligned with individual strings. Moreover, the piezoelectric transducer may be conductively bonded to one or the other of the tailpiece and copper cladding layer.

The tailpiece 192 can be folded up into the channel 187 formed by the shielding 186 by manipulating the tailpiece about flexible junction 194. The folded tailpiece 192 resting within channel 187 is illustrated in FIG. 14. It is noted that hole 135 is positioned above, and adjacent to the right angle tab 126 so as to receive a lead 142 for connection to circuit board 130. The length of the tailpiece provides the necessary distance to allow hole 135 to be positioned in this manner when tailpiece 192 is folded over into channel 187.

Figure 15:
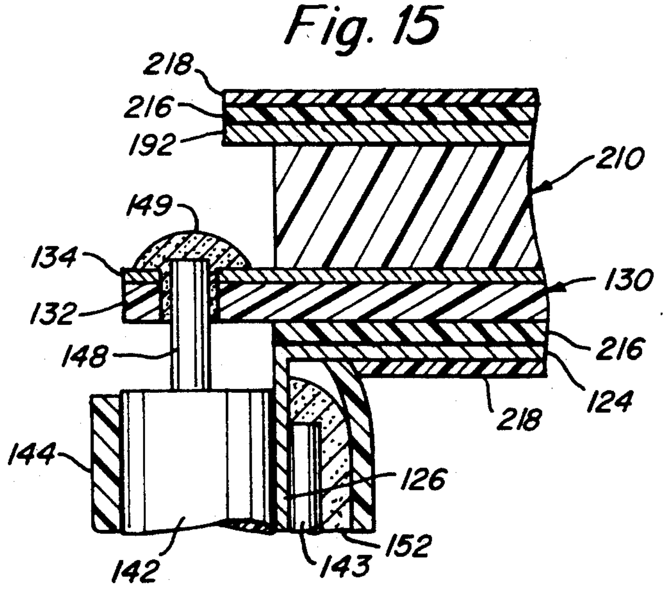
FIG. 15 is a more detailed cross-sectional view of FIG. 14 showing the portion of the ground plane module wherein the input leads connect.

Referring to FIG. 15, the center conductor 148 of lead 142 is soldered at 149 to the circuit board 130, in particular to provide a conductive connection to the cladding 134. Lead 143 has its conductor soldered as at 152 to the tab 126 of the ground plane module 184. Circuit board 130 is soldered to lead 148 by way of cladding layer 134 using solder 149 positioned on top of layer 134. It should be noted that leads 142 and 143 have a plastic shrink tubing 144 extending thereover. FIG. 15 should be contrasted with FIG. 6 which shows lead 142 having a center conductor 148 soldered at 149 interior to the circuit board 130. Positioning the solder on top of the structure, as illustrated in FIG. 15, is advantageous because it makes for a quicker and more efficient assembly of the transducer.

After conductor 148 is soldered, an additional 2 mil layer of Mylar 218 is placed around the shield and circuit board layers as illustrated in FIG. 15.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. A method of fabricating a stringed instrument transducer that is adapted to be positioned adjacent the instrument strings to receive acoustic vibratory signals therefrom, said method comprising the steps of;

providing a module having a first elongated electrically conductive member, a conductive shield means integral with the first conductive member, said conductive member having a conductive tailpiece, the tailpiece adapted to receive a second elongated electrically conductive member and a piezoelectric transducer, said tailpiece having a junction adapted for rotational movement of the tailpiece from a first position where the tailpiece is disposed outside the shield means to a second position where the tailpiece is disposed inside the shield means, providing to the tailpiece a second elongated electrically conductive member and a piezoelectric transducer comprising a polyvinylidene fluoride copolymer, positioning said second elongated electrically conductive member and piezoelectric transducer on the tailpiece to form an elongated unitary structure that includes the piezoelectric transducer disposed between the conductive tailpiece and the second electrically conductive member, disposing around the unitary structure a means for electrically shielding said unitary structure, rotating the tailpiece to its second position that the unitary structure is disposed inside the shield means.

2. The method of claim 1 wherein the step of providing a piezoelectric transducer comprises providing a plurality of piezoelectric transducers, each adapted to be aligned with an instrument string and spacedly disposed along the tailpiece so as to be in alignment with the respective strings when the tailpiece is in its second position.

3. The method of claim 1 wherein the step of providing a piezoelectric transducer comprises providing a piezoelectric transducer of elongated and substantially flat form, the transducer adapted to be aligned with a plurality of instrument strings when the tailpiece is in its second position.

4. The method of claim 1 wherein the step of providing a piezoelectric transducer comprises providing a plurality of elongated and substantially flat transducers as a laminate, the transducer laminate adapted to be aligned with a plurality of instrument strings when the tailpiece is in its second position.

5. The method of claim 1, further comprising the steps of providing means for electrically contacting the conductive shield means and one of said first and second elongated electrically conductive members and providing electrical lead means connected to said first and second electrically conductive members.

6. The method of claim 5, wherein the step of providing means for electrically contacting comprises providing a conductive adhesive means for securing one of said first or said second elongated electrically conductive members to the piezoelectric transducer, said transducer being adhered so as to stress the crystal and thus increase voltage therefrom, at least a major portion of said transducer being adhered to provide the crystal stressing.

7. The method of claim 1, wherein the step of positioning said second elongated electrically conductive member and the piezoelectric transducer on the tailpiece comprises positioning a conductive strip adjacent said piezoelectric transducer and a resilient and electrically conductive layer between said piezoelectric transducer and said conductive strip.

8. The method of claim 1, wherein the step of disposing around said unitary structure a means for electrically shielding said unitary structure, comprises disposing a heat-shrink tubing having a conductive layer disposed thereover.

9. The method of claim 5, wherein the step of providing electrical lead means comprises providing said electrical lead means on a side of said second electrically conductive member adjacent said conductive tailpiece when said conductive tailpiece is in the second position.

10. The method of claim 1, wherein the step of providing a piezoelectric transducer comprises providing a piezoelectric transducer having a thickness of about 50 to about 1000 microns.

11. The method of claim 4, wherein the step of providing a plurality of transducers as a laminate comprises, providing a plurality of piezoelectric transducers having a total thickness of about 500 microns.

12. The method of claim 11, wherein each of said plurality of piezoelectric transducers is about equal in thickness.

13. A method of fabricating a stringed instrument transducer that is adapted to be positioned adjacent instrument strings to receive acoustic vibratory signals therefrom, said method comprising the steps of;

providing a module having a first electrically conductive member comprising a conductive element and a means for conductively shielding the first electrically conductive member, said shield means integral with the first electrically conductive member, said conductive element adapted for movement from a first position, where the conductive element is disposed outside the shield means, to a second position, where the element is disposed inside the shield means, providing to the conductive element a second electrically conductive member and a piezoelectric transducer, said piezoelectric transducer and second electrically conductive member in electrically coupling contact therewith;

positioning said second electrically conductive member and piezoelectric transducer on the conductive element in its first position to form a unitary structure;

disposing around the unitary structure a conductive shield means comprising a base dielectric layer having deposited thereon an electrically conductive layer;

moving the conductive element from its first position to its second position so that the unitary structure is disposed inside the shield means;

providing electric lead means for connecting the shield means with said first and second electrically conductive members when said conductive element is in the second position.

14. The method of claim 13, wherein the step of positioning comprises positioning said second electrically conductive member so that the piezoelectric transducer is disposed between the conductive element and the second electrically conductive member.

15. The method of claim 13, further comprising providing conductive adhesive means for securing the piezoelectric transducer to either the conductive element or the second electrically conductive member, the transducer being secured so as to stress the piezoelectric transducer and thus increase voltage therefrom, at least a major portion of said transducer being bonded to provide the stressing.

16. The method of claim 14, wherein the step of positioning comprises positioning a conductive strip adjacent said piezoelectric transducer and a resilient and electrically conductive carbon fiber layer disposed between said piezoelectric transducer and said conductive strip.

17. The method of claim 13, wherein the step of providing a piezoelectric transducer comprises providing a plurality of piezoelectric transducers, each aligned with an instrument string and spacedly disposed so as to be in alignment with respect to the strings.

18. The method of claim 13, wherein the step of providing a piezoelectric transducer comprises providing an elongated and substantially flat piezoelectric transducer, the transducer adapted to be in alignment with a plurality of instrument strings.

19. The method of claim 18, wherein the elongated and substantially flat piezoelectric transducer is a laminate comprising a plurality of elongated and substantially flat transducers, the laminate aligned with said conductive element and second electrically conductive member.

20. The method of claim 19, wherein said laminate has a total thickness of about 500 microns.

21. The method of claim 20, wherein each of said plurality of piezoelectric transducers is about equal in thickness.

22. The method of claims 13, 17, 18 and 19 wherein said piezoelectric transducer comprises a polyvinylidene fluoride copolymer having greater than about 70 percent crystallinity.

* * * * *